United States Patent [19]

Galli et al.

[11] Patent Number: 5,516,721

[45] Date of Patent: May 14, 1996

[54] ISOLATION STRUCTURE USING LIQUID PHASE OXIDE DEPOSITION

[75] Inventors: Carol Galli, Odenton, Md.; Louis L. Hsu, Fishkill, N.Y.; Seiki Ogura; Joseph F. Shepard, both of Hopewell Junction, N.Y.

[73] Assignee: International Business Machines Corporation, Armonk, N.Y.

[21] Appl. No.: 393,599

[22] Filed: Feb. 23, 1995

Related U.S. Application Data

[63] Continuation of Ser. No. 173,396, Dec. 23, 1993, abandoned.

[51] Int. Cl.$^6$ .................................................. H01L 29/00
[52] U.S. Cl. .......................... 437/67; 437/238; 437/239; 257/510; 257/513
[58] Field of Search .................................... 257/389, 510, 257/513; 437/67, 238, 239, 243, 244

[56] References Cited

U.S. PATENT DOCUMENTS

| | | | |
|---|---|---|---|
| 4,104,086 | 8/1978 | Bondur et al. | 257/510 |
| 4,851,370 | 7/1989 | Doklan et al. | 437/238 |
| 4,970,580 | 11/1990 | Ishii | 257/389 |
| 5,256,593 | 10/1993 | Iwai | 437/70 |
| 5,270,276 | 12/1993 | Ouellet | 437/238 |
| 5,286,664 | 2/1994 | Horiuchi | 437/44 |

OTHER PUBLICATIONS

H. Nagayama et al.; "A New Process for Silica Coating"; J. Electrochem. Soc.: Solid–State Science and Technology, vol. 135, No. 8, Aug. 1988; pp. 2013–2016.

K. Kanba et al.; "A 7 Mask CMOS Technology Utilizing Liquid Phase Selective Oxide Deposition"; IEDM 91, pp. 25.1.1–25.1.4.

T. Homma et al.; "A New Interlayer Formation Technology For Completely Planarized Multilevel Interconnection by Using LPD"; 1990 Symposium on VLSI Technology, pp. 3–4.

B. E. Deal, "Historical Perspectives of silicon Oxidation" In the Physics and Chemistry of $SiO_2$ and $Si$—$SiO_2$ Interfere, Edited, C. B. Holms et al. pp. 5–15.

Primary Examiner—J. Carroll
Attorney, Agent, or Firm—Whitham, Curtis, Whitham & McGinn; Eric W. Petraske

[57] ABSTRACT

A shallow trench isolation structure is formed by a process having a reduced number of steps and thermal budget by filling trenches by liquid phase deposition of an insulating semiconductor oxide and heat treating the deposit to form a layer of high quality thermal oxide at an interface between the deposited oxide and the body of semiconductor material (e.g. substrate) into which the trench extends. This process yields an isolation structure with reduced stress and reduced tendency to develop charge leakage. The structure can be readily and easily planarized, particularly if a polish-stop layer is applied over the body of semiconductor material and voids and contamination of the deposited oxide are substantially eliminated by self-aligned deposition above the trench in the volume of apertures on a resist used to form the trench.

13 Claims, 2 Drawing Sheets

ISOLATION STRUCTURE USING LIQUID PHASE OXIDE DEPOSITION

This application is a continuation of application Ser. No. 08/173,396, filed Dec. 23, 1993 abandoned.

BACKGROUND OF THE INVENTION

FIELD OF THE INVENTION

The present invention generally relates to isolation structures in integrated circuits and, more particularly, to the formation of shallow trench isolation (STI) structures in integrated circuits having high integration density.

DESCRIPTION OF THE PRIOR ART

Integrated circuits in which a plurality of interconnected circuit elements are formed on a single chip are now familiar in many types of electronic devices. Particularly in data processors, it has been recognized that the length of connections is a limiting factor in the reduction of processor cycle time and processor speed and, consequently, the incentive to include as many circuit components as possible on a single chip has been extremely strong. Additionally, if integrated circuit manufacturing yields for a chip design can be maintained at acceptable levels, a high degree of circuit integration yields substantial economies in the manufacture of electronic devices which include such integrated circuits. Therefore, the current trend in integrated circuit design is toward greater integration densities on each chip.

As integration densities have increased and individual circuit elements are placed in closer proximity on a chip, the potential for interactions between circuit elements increases. Therefore, the formation of parasitic circuit elements such as capacitances have become a major problem in current integrated circuit design. Therefore, in recent years it has become necessary in many designs to include isolation structures which are intended to prevent any significant interactions between circuit elements on the same chip.

One familiar form of isolation structure is generically referred to as a recessed oxide isolation (ROI). Recessed oxide isolation may be of several different depths or aspect ratios depending on the anticipated type of circuit interaction. So-called deep trench structures usually have a relatively large aspect ratio (e.g. depth to width) of about 4:1 and have been quite effective to prevent electron movement within the bulk of a semiconductor substrate, principally in designs of bipolar devices and having feature size regimes which have been prevalent over the past few years. However, these type of structures cannot be scaled to feature sizes which are now possible at the current level of integrated circuit technology consistent with retaining their effectiveness for isolation and other device fabrication requirements.

Specifically, as these structures are made smaller and the oxide thinner, capacitive coupling across the oxide increases. Further, with the ROI process, a so-called "bird's beak" shape tends to occur during thermal oxide growth in which silicon oxide tends to grow under a nitride mask and encroach on active device areas. The "bird's beak" can extend much more than 0.1 μm beyond the intended boundary of the ROI structure and intrude upon the area intended for device formation. It can readily be appreciated that such an intrusion or encroachment would occupy a substantial fraction of the device separation distance for even half-micron design ground rules even if the ROI structure was of very narrow design and would be intolerable for quarter-micron design ground rules. The formation of a "bird's beak" also causes a region of high stress to develop between the nitride mask and underlying layers and this high stress region can also encroach into the active device area beyond the region actually occupied by the "bird's beak". These high stress regions may be relieved after the device is placed in service by the formation of crystal dislocations that will be deleterious to the electrical characteristics of the device.

As an alternative, the so-called shallow trench isolation (STI) structure has been developed. Shallow trenches are principally used to control electron movement at a semiconductor surface, particularly in MOSFET devices. Compared to the ROI structure described above, an STI has a reduced aspect ratio and provides a planar upper surface over which conductors may readily be formed. Additionally, a planar surface is beneficial for lithographic exposures since better resolution can be obtained without requiring additional depth of field to maintain a focussed image.

However, currently used processes for producing STI structures are quite complicated and expensive. A typical process sequence includes resist patterning, Reactive Ion Etching (RIE), with or without taper, to form a recess in the substrate, a channel stop implant at the bottom and sidewalls of the trench, stripping of the resist, oxidation of the substrate within the trench to form a sidewall oxide in the trench, a chemical vapor deposition (CVD) oxide fill, block-out resist patterning, a further dry etch for planarization, a chemical-mechanical polish and annealing of the oxide on the trench sidewall. This and similar known processes also tend to create high stress regions in the adjacent device areas which are eventually resolved by the spontaneous formation of dislocation loops in the crystal lattice of the semiconductor substrate. Charge leakage from devices formed in device areas of integrated circuits having STI structures has been associated with such dislocation loops.

Another problem which has been encountered with STI structures is the process of filling narrow trenches with CVD oxide. Since the filling occurs somewhat conformally (e.g. deposition on trench sides may progress somewhat more slowly than on the trench bottom but usually the differential is less than the aspect ratio of the trench), voids can be formed by filling of the upper portion of the narrow trench before lower regions are filled. Further, even for STI structures where the trench aspect ratio is lower, the generally conformal deposition causes a surface void or dimple at the top of the trench which may complicate planarization by processes such as (wet) chemical and or mechanical polishing and also capture contaminants.

To date, the only techniques for alleviating problems with trench filling and stress reduction have involved tapering of the trench which, itself, consumes space, and rounding of the trench bottom. Neither of these techniques, used alone or together, has yielded a solution to either stress reduction or trench filling problems discussed above, consistent with high integration density.

Recently, a liquid phase deposition (LPD) process has been introduced which has successfully deposited silicon dioxide on a substrate surface at low temperature. Specifically, silicon oxide has been deposited on a surface at 35° C. using a solution of fluorosilicic acid ($H_2SiF_6$, sometimes referred to variously as hydrofluorosilicic acid, hydrohexafluorosilicic acid, hydrofluosilicic acid or fluosilicic acid) and boric acid ($H_3BO_3$) which is supersaturated with silica ($SiO_2$), as disclosed in "A New Process for Silica Coating" by Hirotsuga Nagayama et al., published in the Journal of the Electrochemical Society, August, 1988, pp.2013–2016, which is fully incorporated by reference. In summary, the solubility of silica is said to decrease with increasing temperature and a saturated solution can be made transiently supersaturated by increasing temperature or in other ways. The excess silica is then deposited on a surface immersed in the solution while the concentration of resulting hydrofluoric acid is minimized by reaction with the boric acid.

While this low-temperature process is especially useful for forming a dielectric between interconnect layers, and use for sidewall spacers (see "A 7 Mask CMOS Technology Utilizing Liquid Phase Selective Oxide Deposition" by K. Kanba et al., IEDM 91, pp. 25.1.1–25.1.4) has been reported, there has been, heretofore, no reported use of liquid phase deposition on severe topologies or the filling of recesses by selective deposition. However, "A New Interlayer Formation Technology of Completely Planarized Multilevel Interconnection by Using LPN" by T. Homma et al., published in the 1990 Symposium of VLSI Technology suggests that a difference in wettability between a resist and the intended deposition surface can improve selectivity of deposition in openings in resist patterns.

The possibility of low temperature oxide deposition by liquid phase silica deposition is attractive for forming insulators between interconnect layers where the integrated circuit device is substantially complete and the heat budget is small. However, heat treatment at 500° C. (essentially an annealing process to form a more orderly silica network of increased density) has been found to improve dielectric quality of the deposited oxide but such heat treatment is often not feasible where conductors or doped or implanted semiconductor regions are present. For example, elevated temperature causes a dramatic increase in the rate of diffusion of dopants or impurities. Further, the presence of metallic conductors generally limits the temperature of further heat treatment to 350° C. to avoid damage to the conductors.

Further, the improvement in dielectric qualities of the oxide due to heat treatment causes densification and a reduction in volume of the deposited oxide which may cause stressing of the oxide and/or the material on which it is deposited. This stressing can be a source of lattice dislocations which can form charge traps or leaky paths between devices which are adjacent an isolation structure. Thus, annealing of the oxide and the development of improved dielectric qualities thereby cannot be exploited since stresses and dislocations are engendered.

SUMMARY OF THE INVENTION

It is therefore an object of the present invention to provide a process for forming a shallow trench isolation structure having reduced residual stress and which process is of reduced complexity and cost and requires a reduced number of processing steps.

It is another object of the present invention to provide an improved shallow trench isolation structure suitable for extremely high integration density design regimes in electronic integrated circuits.

It is another object of the invention to provide reduced levels of residual stress in a semiconductor structure including a deposit of silicon oxide on a semiconductor material than can be obtained by other processes.

In order to accomplish these and other objects of the invention, a semiconductor device including an insulating structure is provided including a trench extending into a body of semiconductor material, a deposit of insulating oxide which has been deposited by liquid phase deposition substantially filling the trench, and a layer of thermally grown oxide at an interface of the body of semiconductor material and the deposit of insulating oxide in the trench.

In accordance with another aspect of the invention, a method of forming an integrated circuit device is provided, including the steps of forming a trench extending into a body of semiconductor material, substantially filling the trench with an insulating oxide by a liquid phase deposition process, and heat treating the semiconductor material and insulating oxide in trench sufficiently to form a layer of thermal oxide at an interface of the body of semiconductor material and the insulating oxide.

In accordance with a further aspect of the invention, a method of forming a semiconductor structure is provided, including the steps of depositing silicon oxide on a semiconductor material from a supersaturated liquid phase solution containing silica, densifying silicon oxide deposited by the depositing step, and relieving stress at an interface between the silicon oxide and the semiconductor material by growing thermal oxide at the interface in volume sufficient to approximately compensate for change of volume of the silicon oxide during the densification step.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
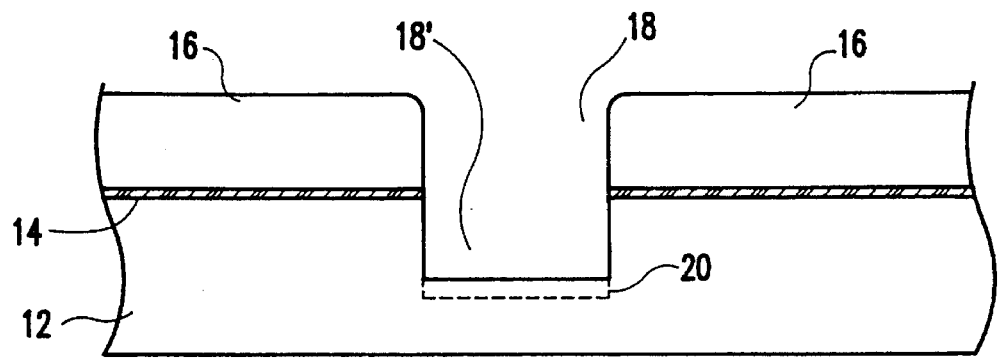
FIGS. 1, 2 and 3 show cross-sectional views of steps in the formation of the shallow trench isolation structure in accordance with the invention.

Referring now to the drawings, and more particularly to FIG. 1, there is shown, in cross-section, an early stage of the manufacture of a shallow isolation trench in accordance with the invention. At this stage, a thin blanket layer of a hard polish-stop material 14, such as an oxide/nitride composite material, has been deposited on substrate 12. A blanket photoresist layer 16 has also been deposited over the polish-stop material and exposed and the exposure pattern has been developed to form openings 18 in the resist. Then, the polish-stop material is opened by a $CF_4$ reactive ion etch (RIE) and the shallow trench 18' formed by a $Cl_2$ RIE.

This patterning and the formation of the shallow trench 18' allows ion implantation to form a channel stop region 20 in a self-aligned manner which is well-understood in the art. It should also be understood that the formation of the structure in accordance with the invention is entirely independent of dopant and implant conductivity types which can be chosen and modified at will in dependence on the types of devices to be formed in the active device regions between the isolation trenches (e.g. to the right and/or the left of the exemplary isolation trench shown). It is also possible and may be advantageous in some circumstances to provide other structures on the substrate such as blanket layers or wells of semiconductor material of differing conductivity type and to form the isolation structure by forming the trench into the body of the semiconductor structure, whether or not the substrate is reached.

Once the channel stop implant is completed, the opening 18, 18' is partially filled by deposition of silicon oxide (e.g. silica) by liquid phase deposition from a supersaturated solution of silica in fluorosilicic acid, preferably containing an effective amount of boric acid to remove hydrofluoric acid which is formed during the oxide growth. Temperature of the deposition is non-critical, particularly since it is preferred to form the isolation structures prior to the formation of active devices or conductors. Therefore, there is essentially no "heat budget" to be observed at this point in the fabrication of the integrated circuit device.

Figure 2:
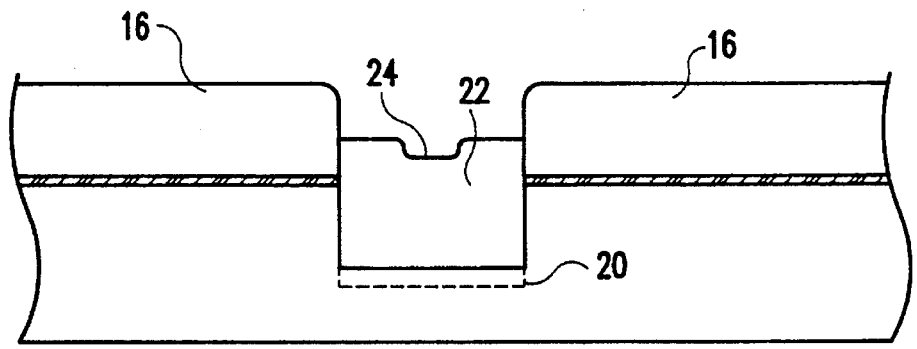
Figure 3:
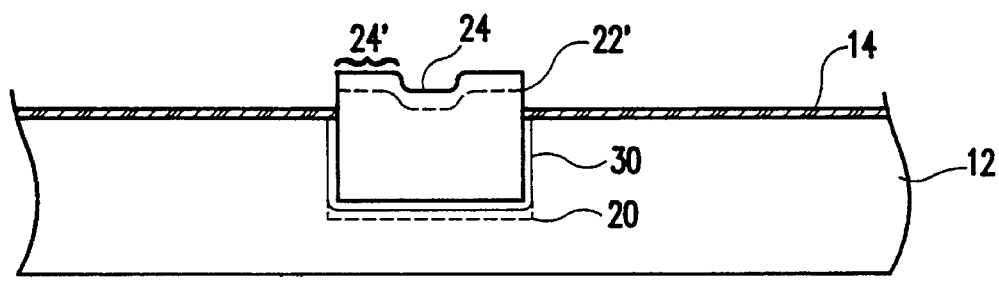

It is preferable that the deposition process be continued until the oxide growth fills the shallow trench 18' and a significant portion of the opening 18 in the photoresist as shown at 22 of FIG. 2. The growth of oxide is neither ideally conformal nor ideally isotropic; the growth rate from the sides of the trench being significantly less than the growth rate from the trench bottom, yielding a dimple 24 in the surface of the oxide deposit. Because of this dimple 24 as well as the change of profile during densification (to the approximate profile shown at 22' of FIG. 3) it is preferred to continue the oxide deposition until the bottom of the dimple is reliably raised above the plane of the upper surface of the polish-stop layer 14 by a distance greater than the change in dimple location during densification so that the dimple can be fully and reliably removed by planarization, as will be described more fully below.

Figure 5:
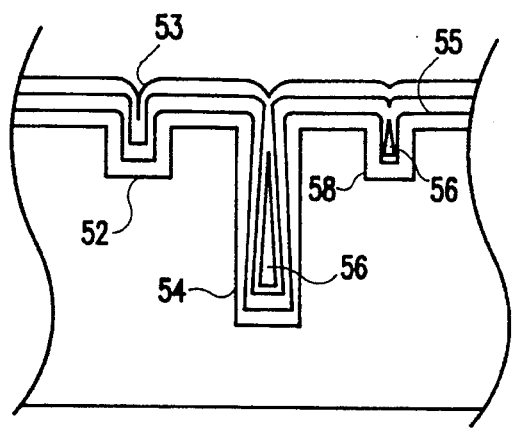
FIGS. 5, 6A and 6B are cross-sectional views of shallow trench structures of different sizes and provide a comparison of deposition profiles of liquid phase oxide deposition with high-temperature deposition techniques.

Referring briefly to FIGS. 5 and 6, the difference in deposition profiles between liquid phase deposition and high-temperature CVD deposition techniques will be briefly discussed. As shown in FIG. 5, chemical vapor deposition results in a substantially conformal layer of oxide to be deposited in a trench. However, the size and aspect ratio of the trench causes differences in thickness of this layer. Specifically, in FIG. 5, low aspect ratio trench 52 allows substantially conformal deposition of oxide in layers (corresponding to generally equal time increments during the deposition process). Note, however, that as the conformal deposit thickens, the effective aspect ratio becomes larger, slowing deposition at the trench bottom. In shallow trench 52, this may not be of significance and the trench may be adequately filled. However, even if the trench can be adequately filled, the dimple 53 is quite deep and can collect contaminant materials during later planarization.

The effect of variation in thickness due to increase of aspect ratio as conformal CVD proceeds is much more pronounced for trench 54. In this case, deposition proceeds more rapidly near the top of the trench and causes restriction of the rate of deposition at lower levels of the trench. This effect becomes more aggravated as the deposition proceeds. Eventually, the top of the trench is closed before filling can be completed and a large "key-hole" defect 56 is formed. As referred to earlier, this effect may be limited by forming the trench with outwardly inclined walls to delay restriction of deposition at the bottom of the trench. However, this expedient can only be employed at the expense of increased width at the top of the trench; limiting the integration density which can be achieved.

This same effect is also pronounced at relatively low aspect ratio trenches which are formed with a narrow width as seen at 58. Note that the effective aspect ratio of the deposit profile at line 55 has effectively tripled from the aspect ratio of the original trench. While deposition may be substantially conformal in the early stages of deposition, the effective aspect ratio changes very rapidly and may cause formation of a void 56' in a fashion similar to "key-hole" defect 56 formed in trench 54.

Figure 6A:
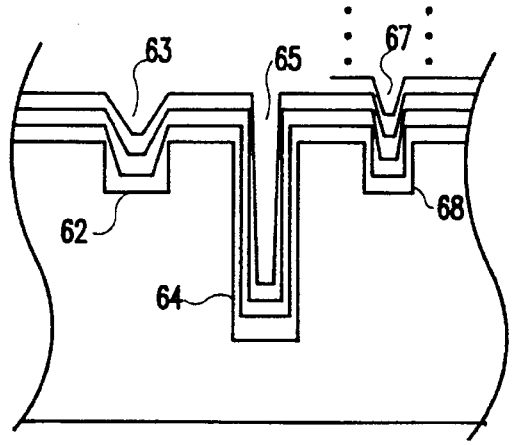
Figure 6B:
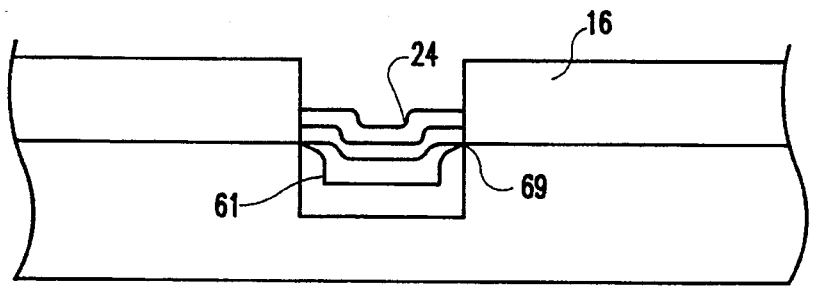

In contrast, as shown in FIG. 6A, liquid phase deposition has been found, by the inventors, to proceed largely from the bottom of the trench with a much reduced deposition rate on the sides of the trench. While not wishing to be held to any particular theory, since the deposition is done from a super-saturated solution of silica, deposition occurs at the threshold of precipitation and is thus anisotropic, preferentially depositing a greater thickness in a direction perpendicular to the deposition surface. Thus, as deposition proceeds, relatively open dimples 63, 65, 67 are formed which do not impede deposition at the bottom of the trench and are far less susceptible to retaining contaminants that the deep dimple 53 formed by CVD.

Liquid phase deposition can also be performed with relatively high selectivity. If, as is preferred and shown in FIGS. 1 and 6B, a resist layer 16 is provided substantially congruent with the trench opening 61, deposition on the surfaces of the resist can be substantially or completely avoided during filling of the trench. Slow deposition on the sidewalls also retards growth of "shoulders" on the deposited oxide until the trench is substantially filled. Thereafter, as deposition continues into the thickness of the resist 16, deposition becomes more nearly conformal and results in only a shallow and open dimple 24, well above the substrate surface. It can therefore be clearly seen that liquid phase deposition is well-suited to the filling of trenches in isolation structures, particularly at very small sizes and is not limited to previously known applications such as conductor layer insulation. Moreover, the deposition profiles developed by liquid phase deposition significantly reduce the tendency to form voids and other defects which have been associated with the filling of small or high aspect ratio trenches by CVD.

After the liquid phase oxide deposition has been completed, as described above, resist 16 is removed as shown in FIG. 3 and the wafer is rinsed, dried and annealed in an oxygen furnace. The time and temperature of the annealing process is preferably determined as sufficient to grow a thin layer of oxide 30 at the interface of the substrate and the deposited oxide. (Approximately 100 Angstroms of thermal oxide is sufficient to provide electrical interface in terms of charge and interface states. Conditions of oxidation are relatively less important than temperature since interface charge densities are established by the annealing temperature to which the device was most recently exposed.) This thermal oxide is preferably grown in a post-anneal process at 800° C. ±100° C. for a period of 30 minutes ±15 minutes for an isolation structure formed in accordance with quarter-micron to half-micron design ground rules. While some annealing of the oxide will also take place, increasing density of the deposited oxide and reducing the dielectric constant, the annealing of the oxide has been found to be of lesser importance than the formation of the thermal oxide at the interface. (Also because of the densification of the deposited oxide, it is preferred that the deposition be continued to a point that the bottom of dimple 24 will remain at or above the plane of the upper surface of the polish-stop layer 14 after heat treatment.)

The poor interface quality between the deposited oxide and the substrate, alluded to above, has been found to form a charge trap which may eventually become conductive. That is, the interface may include charges and/or interface states which can induce channeling around the sidewalls of the trench. Therefore, the formation of the thermal oxide is considered to be important to the invention since it not only improves the interface quality by filling gaps and relieving dislocations which may form during the densification of the oxide but is believed to improve dielectric qualities of the oxide deposited by liquid phase deposition since the densification and oxygenation may eliminate voids and charge centers in addition to saturation of dangling bonds which can attract mobile charge and result in leaky paths between adjacent devices. Thermal oxidation will also compensate for any shrinkage of the LPD oxide caused by densification, preventing separation of trench fill from the sidewalls. Therefore, the electrical insulation and prevention of charge leakage provided by the isolation structure in accordance with the invention is principally a function of the thermal oxide grown during the heat treatment. Further, the growth of thermal oxide provides a mechanism of stress relief which is not available in other oxide deposition processes where the as-deposited oxide is relatively dense and residual stress must be tolerated. It is therefore preferred to grow thermal oxide to the point of minimizing stresses in the semiconductor device structure which also assures adequate thermal oxide thickness to produce good electrical properties.

Figure 4:
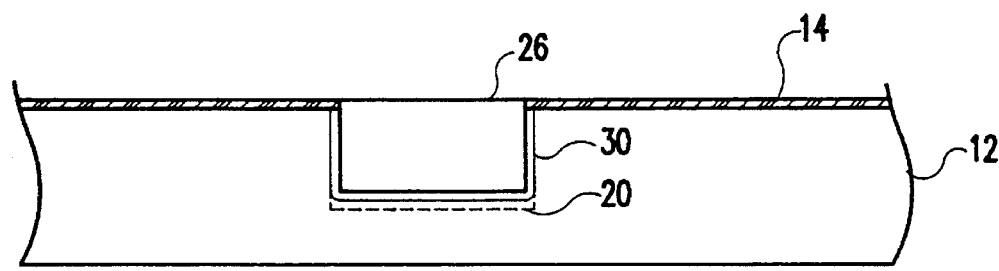
FIG. 4 shows a cross-sectional view of a completed shallow trench isolation structure in accordance with the invention.

As shown in FIG. 4, the isolation structure is completed by a light chemical-mechanical polish to remove the portion of the deposited oxide protruding above the surface of polish-stop layer 14 which is preferably provided to facilitate the polishing process and to avoid damage to the underlying body of semiconductor material (e.g. the substrate 12) to make the final upper surface 26 of the oxide deposit 24 coplanar with the upper surface of layer 14.

It should be noted that there has been no observed tendency toward the formation of "bird's beaks" under the edge of the nitride mask during trench filling by liquid phase deposition, as was encountered in the recessed oxide isolation processes of the prior art, therefore allowing deep sub-surface isolation structures, not previously feasible, to be formed. Likewise, any contamination of dimple 24 or any void formed at that location is removed during planarization.

Figure 7:
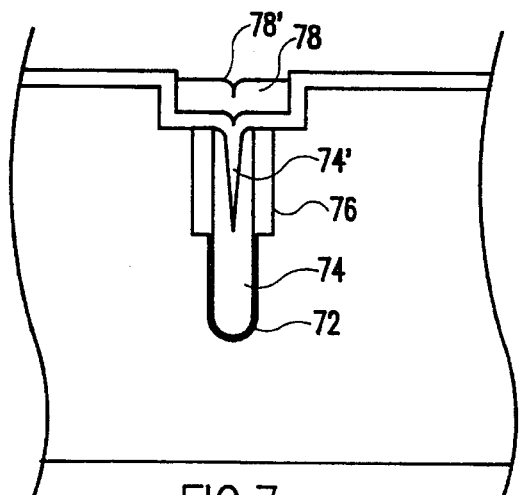
FIGS. 7 and 8 are cross-sectional views of deep trench capacitor structures comparing the structure resulting from liquid phase deposition with that resulting from high-temperature deposition.
Figure 8:
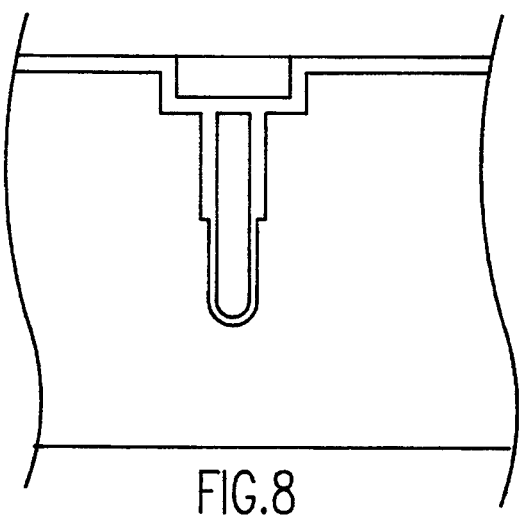

Referring now to FIGS. 7 and 8, a particularly attractive application, other than an isolation structure, for the invention will now be described. Specifically, owing to the superior dielectric qualities and the ability to fill deep trenches, the methodology of the invention is also applicable to the formation of deep trench storage capacitors of small "footprint" such as are used in high capacity dynamic random access memories, which are familiar computer components. Likewise, the structure of such capacitors, including node oxide 72, a polycrystalline silicon plate 74 (polyplate), a collar oxide 76 and a silicon cap 78, surrounded by thermal oxide, is generally familiar to those skilled in the art and the functions of these structural features need not be further described.

FIG. 7 shows a cross-section of a conventional deep trench capacitor formed by high-temperature chemical vapor deposition. It will be appreciated that the various structural features involve filling of trenches with material and the development of oxide at the interfaces of the deposits and the substrate. Two problems have been encountered with conventional depositions of materials in the deep trench which are similar to problems solved by the invention in isolation structures. First, the poly plate 74 and cap 78 will each have a seam 74' and 78', respectively, similar to the deep dimple 53 of FIG. 5 and due to the same deposition mechanism previously described. When thermal oxide is grown at the interfaces, thermal oxide is also grown at the seams which causes stresses which may later be resolved by formation of dislocations. Second, high temperature deposition processes, such as CVD, also create more stress-induced defects and dislocations.

As shown in FIG. 8, the improved filling by liquid phase deposition and densification by annealing avoids the production of a seam in which thermal oxide may grow. No stress-induced dislocations occur during deposition since deposition occurs at low temperature. Further, densification reduces the volume of the deposited material in a controlled, predictable and repeatable manner and stresses induced by the heat treatment are relieved and dislocations and voids filled by the growth of the thermal oxide. Further, as in the case of the isolation trench, the deposited oxide is of particularly good dielectric quality and increased dielectric constant, potentially allowing trench capacitors to be reduced in size without reduction of capacitance. Therefore, in accordance with the invention, the combination of low temperature deposition (with or without some degree of thermal densification) together with the growth of thermal oxide (which will, itself, cause some degree of densification, tending to reduce stresses which would otherwise be caused by thermal oxide growth) provides an insulative structure of improved performance, manufacturing yield and structural characteristics in a variety of structures which require filling of a trench-like feature.

In view of the foregoing, it is seen that the invention provides a simple STI structure and method of formation thereof which involves only simple and self-aligned process steps which can be conducted with equipment of relatively low cost. The structure is easily planarized and is capable of filling relatively high aspect ratio trenches. The structure provides very low leakage and is very stable over time and electrical and thermal stress cycles since there is little stress induced in the structure by the liquid phase deposition process and that level of intrinsic stress can be maintained at a low level by choice of oxidation and heat treatment conditions by techniques which will be apparent to those skilled in the art in view of this description of the invention. Further, while it may be of reduced importance if the isolation structure is formed prior to formation of any portion of the active devices of the integrated circuit, the thermal cycle necessary to grow the thermal oxide 30 is very short and well within the "heat budgets" allowed for the formation of many types of devices and portions thereof as long as metallic conductors are not present. Since the process is entirely self-aligned after the initial resist exposure, the process and structure of the invention are fully compatible with any design rules and minimum feature sizes which can be achieved at any available level of lithographic technology and the available level of lithographic precision can be fully exploited. It should also be appreciated that the invention is not limited to silicon substrates and that the silica deposited from the liquid phase allows the thermal growth of silicon oxide at an interface to substrates or layers of other materials such as germanium, indium and gallium/gallium arsenide.

While the invention has been described in terms of a single preferred embodiment, those skilled in the art will recognize that the invention can be practiced with modification within the spirit and scope of the appended claims.

Having thus described my invention, what is claimed as new and desired to be secured by Letters Patent is as follows:

1. A method for forming a semiconductor structure including the steps of depositing silicon oxide in a recess on a semiconductor structure from a supersaturated liquid phase solution containing silica, densifying said silicon dioxide deposited by said depositing step, and relieving stress at an interface between said silicon oxide deposited by said depositing step and said semiconductor material by growing thermal oxide at said interface in volume sufficient to approximately compensate for change of volume of said silicon oxide deposited by said depositing step during the densifying step.

2. A method of forming an integrated circuit device including the steps of forming a trench extending into a body of semiconductor material, substantially filling said trench with an insulating oxide by a liquid phase deposition from a supersaturated solution process, and heat treating said semiconductor material and said insulating oxide in said trench sufficiently to form a layer of thermal oxide at an interface of said body of semiconductor material and said insulating oxide.

3. A method as recited in claim 2, wherein said step of forming a trench includes the further steps of applying a patterned layer of resist over said body of semiconductor material, and etching said body of semiconductor material through said patterned layer of resist.

4. A method as recited in claim 3, wherein said etching step is performed by reactive ion etching.

5. A method as recited in claim 3, wherein said step of applying a patterned layer of resist includes the steps of applying a blanket layer of resist, and opening a pattern of apertures in said blanket layer of resist.

6. A method as recited in claim 2, wherein said step of forming a trench includes the further steps of applying a polish-stop layer over said body of semiconductor material, applying a patterned layer of resist over said polish stop layer, and etching said polish stop layer and said body of semiconductor material through said patterned layer of resist.

7. A method as recited in claim 6, wherein said etching step is performed by reactive ion etching.

8. A method as recited in claim 6, wherein said step of applying a patterned layer of resist includes the steps of applying a blanket layer of resist, and opening a pattern of apertures in said blanket layer of resist.

9. A method as recited in claim 3, wherein said step substantially filling said trench includes filling a portion of an aperture in said patterned layer of resist.

10. A method as recited in claim 9, including the further steps of removing said patterned layer of resist, and planarizing said insulating oxide.

11. A method as recited in claim 6, wherein said step substantially filling said trench includes filling a portion of an aperture in said patterned layer of resist.

12. A method as recited in claim 11, including the further steps of removing said patterned layer of resist, and planarizing said insulating oxide to a surface of said polish-stop layer.

13. A method as recited in claim 2, including the further step of forming a channel stop region at the bottom of said trench.

* * * * *